United States Patent [19]

Zoutendyk

[11] Patent Number: 5,072,133

[45] Date of Patent: Dec. 10, 1991

[54] METHOD AND APPARATUS FOR INCREASING RESISTANCE OF BIPOLAR BURIED LAYER INTEGRATED CIRCUIT DEVICES TO SINGLE-EVENT UPSETS

[75] Inventor: John A. Zoutendyk, La Crescenta, Calif.

[73] Assignee: The United States of America as represented by the Administrator of the National Aeronautics and Space Administration, Washington, D.C.

[21] Appl. No.: 692,801

[22] Filed: Feb. 20, 1991

Related U.S. Application Data

[63] Continuation of Ser. No. 311,552, Feb. 16, 1989, abandoned.

[51] Int. Cl.$^5$ .......................... H03K 3/01; H03K 3/26; H03K 3/284; G01T 1/24
[52] U.S. Cl. .............................. 307/296.2; 307/296.7; 307/303; 307/311; 307/272.1; 357/29
[58] Field of Search ............... 307/296.1, 296.2, 296.7, 307/272.1, 273, 303, 311; 357/29

[56] References Cited

U.S. PATENT DOCUMENTS

| | | | |
|---|---|---|---|
| 3,462,311 | 8/1969 | Ross | 136/39 |
| 3,617,829 | 11/1971 | Lesk | 317/235 R |
| 4,225,797 | 9/1980 | Fredrickson | 307/278 |
| 4,377,756 | 3/1983 | Yoshihara et al. | 307/296 R |
| 4,491,746 | 1/1985 | Koike | 307/296 R |
| 4,633,291 | 12/1986 | Koyama | 357/51 |
| 4,670,669 | 6/1987 | Cottrell et al. | 307/297 |

OTHER PUBLICATIONS

Malcolm E. Goodge, "Semiconductor Device Technology", Howard W. Sams & Co., Inc. (1983), pp. 104–105.
John A. Zoutendyk, "Modeling of Single-Event Upset in Bipolar Integrated Circuits," IEEE Transactions on Nuclear Science, vol. NS-30, No. 6, pp. 4540–4545, Dec. 1983.
J. Zoutendyk, L. Smith, G. Soli, P. Thieberger and H. Wegner, "Single-Event Upset (SEU) Model Verification and Threshold Determination Using Heavy Ions in a Bipolar Static Ram," IEEE Transactions on Nuclear Science, vol. NS-32, No. 6, pp. 4164–4169, Dec. 1985.
John A. Zoutendyk et al., "Empirical Modeling of Single-Event Upset (SEU) in NMOS Depletion-Mode-Load Static Ram (SRAM) Chips," IEEE Transactions on Nuclear Science, vol. NS-33, No. 6, pp. 1581–1585, Dec. 1986.
John A. Zoutendyk et al., "Experimental Evidence for a New Single-Event Upset (SEU) Mode in a CMOS SRAM Obtained from Model Verification," IEEE Transactions on Nuclear Science, vol. NS-34, No. 6, pp. 1292–1299, Dec. 1987.

Primary Examiner—Stanley D. Miller
Assistant Examiner—Trong Phan

[57] ABSTRACT

Bipolar transistors fabricated in separate buried layers of an integrated circuit chip are electrically isolated with a built-in potential barrier established by doping the buried layer with a polarity opposite doping in the chip substrate. To increase the resistance of the bipolar transistors to single-event upsets due to ionized particle radiation, the substrate is biased relative to the buried layer with an external bias voltage selected to offset the built-in potential just enough (typically between about +0.1 to +0.2 volt) to prevent an accumulation of charge in the buried-layer-substrate junction.

10 Claims, 3 Drawing Sheets

METHOD AND APPARATUS FOR INCREASING RESISTANCE OF BIPOLAR BURIED LAYER INTEGRATED CIRCUIT DEVICES TO SINGLE-EVENT UPSETS

ORIGIN OF THE INVENTION

The invention described herein was made in the performance of work under a NASA contract, and is subject to the provisions of Public Law 96-517 (35 USC 202) in which the Contractor has elected not to retain title.

This application is a continuation, of application Ser. No. 07/311,552, filed Feb. 16, 1989 now abandoned.

TECHNICAL FIELD

This invention relates to a method and apparatus for increasing the resistance of bipolar transistors in buried-layer integrated circuits to single-event upsets.

BACKGROUND ART

Both bipolar and MOS integrated circuits (ICs) have been shown empirically to be susceptible to soft errors when exposed to radiation of ionized particles, and in particular to penetration of an ionized particle referred to hereinafter as a single-event upset (SEU). A "soft error" is defined as a nondestructive data bit error, as opposed to a "hard error" resulting from permanent damage to the IC by an ionized particle.

ICs that contain memory cells or other forms of latch circuits have been known to be upset by single cosmic ray particles in space, and by various radiation sources in ground-based electronic systems, resulting in soft errors. The basic mechanism for such occurrences has been generally recognized to be the collection of charge created by an ion passing through an integrated transistor. The charge collected from a semiconductor junction (e.g., the buried-layer-substrate junction of a bipolar transistor in the "off" state) may be of sufficient magnitude to change the state of a bistable circuit incorporating the transistor or to produce a transient output of a nonconducting transistor in a logic gate circuit incorporating the transistor.

Soft errors generated in random access memories (RAMs) and other bistable circuits, by single ionizing particles, have been observed in controlled laboratory experiments. These experiments have been performed with a wide range of ions and ion energies, from protons to heavy ions (e.g., krypton) from a cyclotron, van de Graaff, or linear accelerator. For a more detailed introduction to single-event upsets in bipolar transistors, see John A. Zoutendyk, "Modeling of Single-Event Upset in Bipolar Integrated circuits," IEEE Transactions on Nuclear Science, Vol. NS-30, No. 6, December 1983; and John A. Zoutendyk, et al., "Single-Event Upset (SEU) Model Verification and Threshold Determination Using Heavy Ions in a Bipolar Static RAM," IEEE Transactions on Nuclear Science, Vol. NS-32, No. 6, pp. 4164–4169, December 1985.

Following some further discussion of the problem, a solution will be presented with respect to bipolar transistors in integrated circuits, and more specifically with respect to bipolar transistors fabricated in buried layers of semiconductor material, where the buried-layer-substrate junction is normally reverse biased to prevent possible leakage of current between adjacent transistors, each fabricated in its own buried layer.

Single-particle, soft-error generation in ICs has become an important phenomenon in the pursuit of high-density semiconductor chip technology. Bit errors can be caused by a single energetic ion, e.g., a cosmic-ray ion in space, or an alpha particle from radioactive decay. As transistors contained in IC chips become increasingly smaller, they become more susceptible to soft errors owing to the decrease in the amount of ionized charge required to cause an SEU. In latch circuits, such as RAM cells comprised of two cross-coupled transistors commonly referred to as flip-flops, an energetic ion passing through the transistor that is initially off, may tend to turn off the other transistor which is initially on. That will then drive the transistor that was initially off to a full "on" state, and thus drive the "on" transistor to the "off" state. The result is that the memory cell will flip from one to the other state and introduce a bit error. An SEU error in a flip-flop is thus manifested by a "bit flip." This phenomenon is caused by ions that penetrate an active device and produce ion-induced current, $I_s$, which causes charge to be collected at the buried-layer-substrate junction. Thus, the current $I_s$ of an ion track can cause an SEU when the ion track is within the buried-layer area of a bipolar transistor. Each ion track may cause an SEU bit error in a flip-flop or other form of latch, such as static RAM chips, and in transistors used in logic networks of gates and inverters, because a transient ion-induced current may trigger a following flip-flop or other form of latch to change its state.

Space charge effects militate against the exact analytical treatment of ion tracks making it necessary to solve SEU problems using numerical computer methods. This situation arises from the nonlinearity of the multidimensional differential equations governing collection of the high-injection charge produced by an ion track. Metal-oxide-semiconductor (MOS) RAMs have also been modeled for single-event upset. See John A. Zoutendyk, et al., "Empirical Modeling of Single-Event Upset (SEU) in NMOS Depletion-Mode-Load Static RAM (SRAM) Chips," IEEE Transactions on Nuclear Science, Vol. NS-33, No. 6, pp. 1581–1585, December 1986; and John A. Zoutendyk, et al., "Experimental Evidence for a New Single-Event Upset (SEU) Mode in a CMOS SRAM Obtained From Model Verification," IEEE Transactions on Nuclear Science, Vol. NS-34, No. 6, pp. 1292–1299, December 1987. In MOS RAMs, only a single charge-collection node is involved during any single event, even though different nodes may be charged during different events. By contrast, in a buried-layer IC construction of bipolar transistors, several nodes may be involved during a single event.

STATEMENT OF THE INVENTION

In accordance with the present invention, the solution to the problem of single-event upsets in bipolar transistors fabricated in buried layers of integrated circuit chips is to bias the substrate relative to the buried layers just enough (typically between about −1 to +0.2 volt) to prevent an accumulation of charge. For example, in a bipolar transistor having its collector contact connected to its base-collector junction through a collector contact layer over a buried layer in the substrate, the buried-layer-substrate junction (being normally reverse biased to prevent leakage current to transistors in adjacent buried layers) is forward biased by a voltage applied between the collector node and a contact to the substrate. This bias voltage level applied is normally insufficient for the buried-layer-substrate junction diode, $D_s$, to conduct until an ion-induced current, $I_s$, is present. The diode $D_s$ then conducts to prevent an accumulation of charge that may effect the conduction of the transistor fabricated in the buried layer.

BRIEF DESCRIPTION OF THE DRAWINGS

FIG. 1b is a cross section taken along a line B—B in FIG. 1a.

FIG. 2b is a timing diagram useful in understanding the effect of an ion induced current pulse, $I_s$, in the flip-flop circuit of FIG. 2a.

DETAILED DESCRIPTION OF THE INVENTION

Bipolar integrated circuits are particularly vulnerable to single-event upsets because the active elements of bipolar transistors are p-n junctions which readily collect the charge generated by incident high-energy ions. The region most vulnerable in a bipolar IC transistor is the junction formed by the substrate and the buried layer to which the collector is connected by an epitaxial layer (epilayer) in the buried layer. The buried layer connects the collector contact region to the active collector region in the epilayer. The buried-layer-substrate junction is normally reverse biased to prevent leakage between transistors in adjacent buried layers.

Figure 1A:
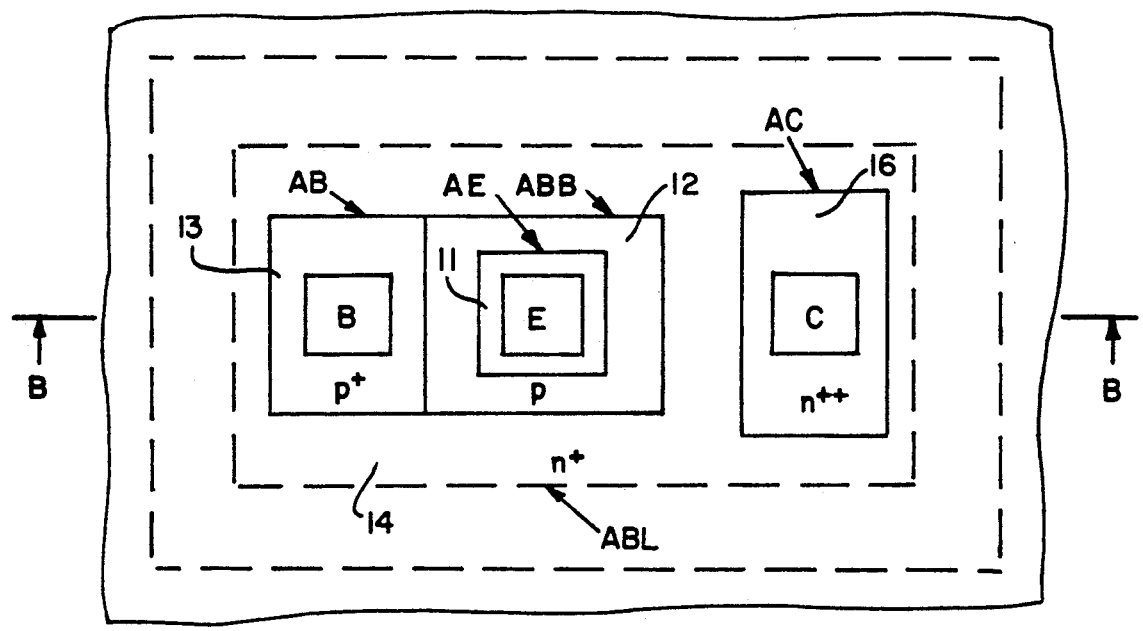
FIG. 1a is a plan view of a bipolar IC transistor showing its topology in a chip.
Figure 1B:
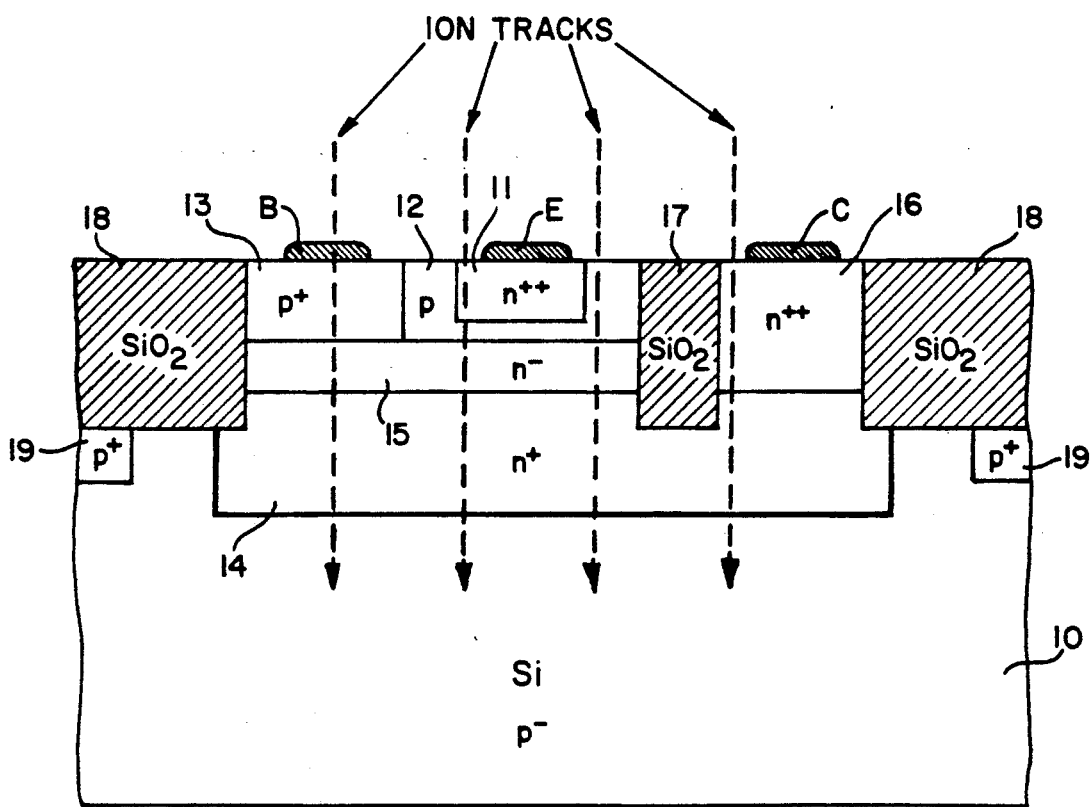

FIGS. 1a and 1b illustrate a typical buried-layer design used throughout the silicon semiconductor industry in fabricating bipolar IC transistors on a substrate 10. FIG. 1a shows the topology in a plan view of a specific structure of an NPN transistor in advanced buried layer technology, and FIG. 1b shows a cross section along line B—B in FIG. 1a with SEU-producing ion tracks indicated by dashed lines as passing through the various regions of the device and penetrating the junction between the substrate 10 and a buried layer 14. The very highly doped n++ emitter layer 11 with surface area AE, to which an emitter contact E is made, is surrounded by a lightly to moderately doped p-type buffer base layer 12 with surface area ABB. The actual base contact B is made in an adjoining p+ layer 13 with an area AB. This structure minimizes the base resistance, which results in a lower base-emitter voltage for high-performance transistor operation. A similar procedure is used to minimize the collector resistance, wherein a highly doped n+ buried layer 14 of area ABL is provided under a lightly doped n- epilayer 15 (of area equal to AB plus ABB) which provides a base-emitter current path. The area AC shown in FIG. 1a is initially part of the epilayer 15 shown in FIG. 1b, and is then highly doped n++ to provide a highly conducting layer 16 for the collector contact C. Once the n- epilayer is grown epitaxially, the buffer-base layer 12 and base contact layer 13 are doped p and p+, respectively, with p-type impurities. The emitter layer 11 and the collector contact layer 16 are both heavily doped n++ with n-type impurities.

The low collector resistance achieved by this structure results in a lower collector-emitter voltage and power dissipation for high-performance transistor operation. The buried-layer-substrate junction thus formed by the p- doping in the substrate 10 and the n+ doping of the buried layer 14 (FIG. 1b), is reverse biased to prevent the possible leakage of current between adjacent transistors in separate buried layers, as noted above. An isolation region 17 of silicon dioxide (SiO2) is produced in a conventional manner to electrically isolate the collector contact layer 16 from the base and emitter contact layers except through the buried layer 14. In that way, base-emitter current controls collector-to-emitter current. The whole transistor is electrically isolated from adjacent transistors on the chip by a surrounding SiO2 layer 18 over a $p^{30}$ guard ring 19.

Each of the penetrating ion tracks shown in FIG. 1b which penetrates the buried layer 14 causes charge to be collected at the buried-layer-substrate junction. Consequently, each of the ion tracks passing through the buried layer 14 into the substrate 10 can cause an SEU, such as in a data-storage memory cell comprised of cross-coupled transistors $Q_1$ and $Q_2$ shown in FIG. 2a, because each track induces a time-dependent current $I_s(t)$ in the buried-layer-substrate junction. That current is represented schematically in FIG. 2a as a current generator in parallel with a diode $D_S$ and an inherent parallel capacitance $C_s$ between the collector of a transistor $Q_1$ used in the flip-flop and the substrate of the IC chip. There is a corresponding diode $D_S$ for the transistor $Q_2$ with inherent parallel capacitance, but it is not shown for the condition of transistor $Q_1$ "off" and transistor $Q_2$ "on" because an ion track passing through the buried layer of the transistor $Q_2$ will only have the equivalent effect of making the transistor $Q_2$, which is already "on," even more conductive. The error produced by an SEU is the generation of a time dependent current $I_s(t)$ which has an effect equivalent to turning the "off" transistor $Q_1$ to the "on" state, thereby causing the bistable circuit to flip. If that transistor is in a logic gate circuit instead of a bistable circuit, producing an event that is equivalent to turning the "off" transistor "on" may create a logic error that triggers a downstream bistable circuit to its alternate state.

Figure 2A:
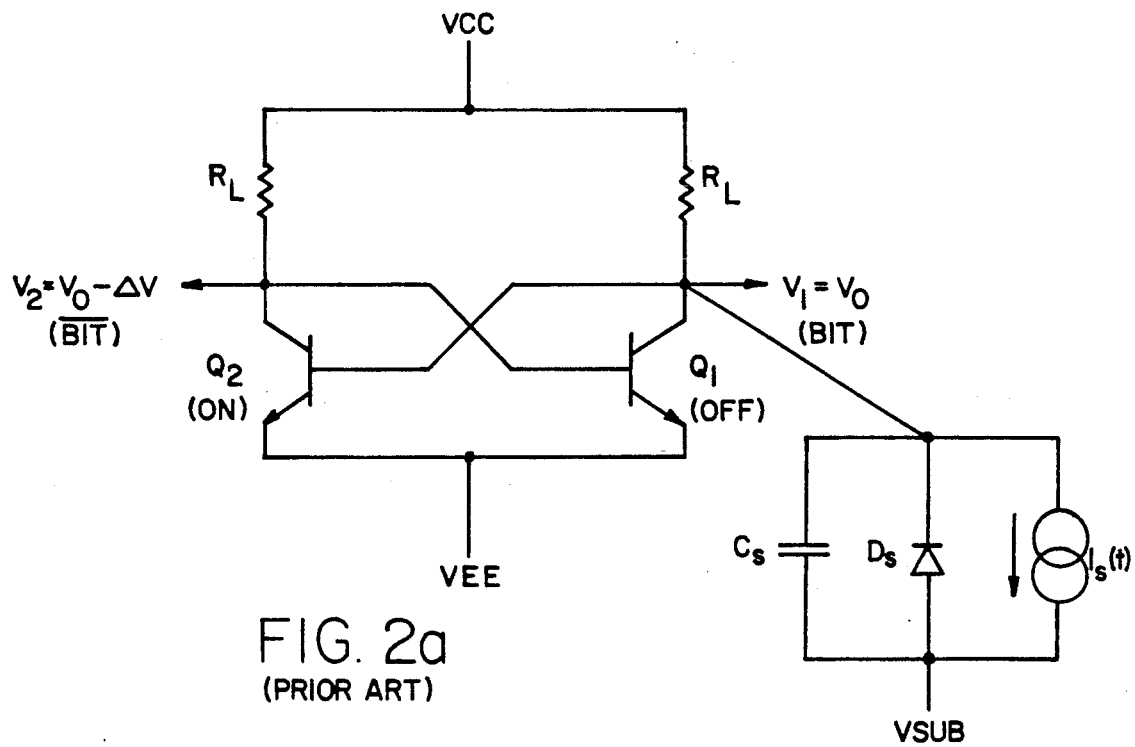
FIG. 2a is a schematic circuit diagram of a single-bit memory cell (flip-flop) showing two cross-coupled NPN bipolar transistors, each fabricated in a buried layer, and a diode $D_S$ with its associated capacitance, $C_s$, representing the buried-layer-substrate junction of one of the transistors.

In further development of the foregoing discussion as it applies specifically to a flip-flop as shown in FIG. 2a, an ion track that goes through the buried layer 14 into the substrate 10 produces a current pulse indicated by a current generator $I_s(t)$ in FIG. 2a. A single-event upset error will occur only if the ionized particle passes through the "off" (nonconducting) transistor. This current causes the voltage $V_1$ of the collector of transistor $Q_1$ to drop from a level that is high relative to the collector voltage $V_2$ of the "on" (conducting) transistor $Q_2$. When the voltage $V_1$ drops by more than $\Delta V = V_1 - V_2$ (the logic voltage margin of the flip-flop), the transistor $Q_2$ begins to turn off causing the base of the transistor $Q_1$ to begin to rise. This in turn tends to cause the transistor $Q_1$ to turn on, further droping its collector voltage, and thus further turning the transistor $Q_2$ off. The regenerative action of the cross-coupled transistors then drives the transistor $Q_1$ fully on and the transistor $Q_2$ fully off. Thus, as the collector voltage $V_1$ of the transistor $Q_1$ becomes less than the base voltage required to keep the base-emitter current of the transistor Q₂ on, the transistor Q₂ is turned off, and the state of the bistable circuit is flipped.

Figure 2B:
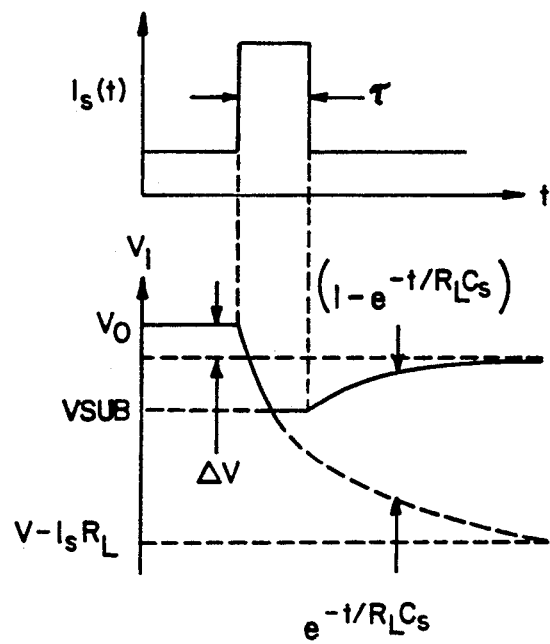

The current pulse shown in FIG. 2b is shown as a "square" pulse used in a simulated test model. The width $\tau$ of the ion-generated current pulse is an important parameter which reflects the actual time in which the charge collection from an ion track occurs. The exact value of $\tau$ to be used could be derived only from accurate charge-collection numerical calculations. In the modeling of a single-event upset, the parametric behavior of variable $\tau$ values were studied, and the results were incorporated.

Figure 3:
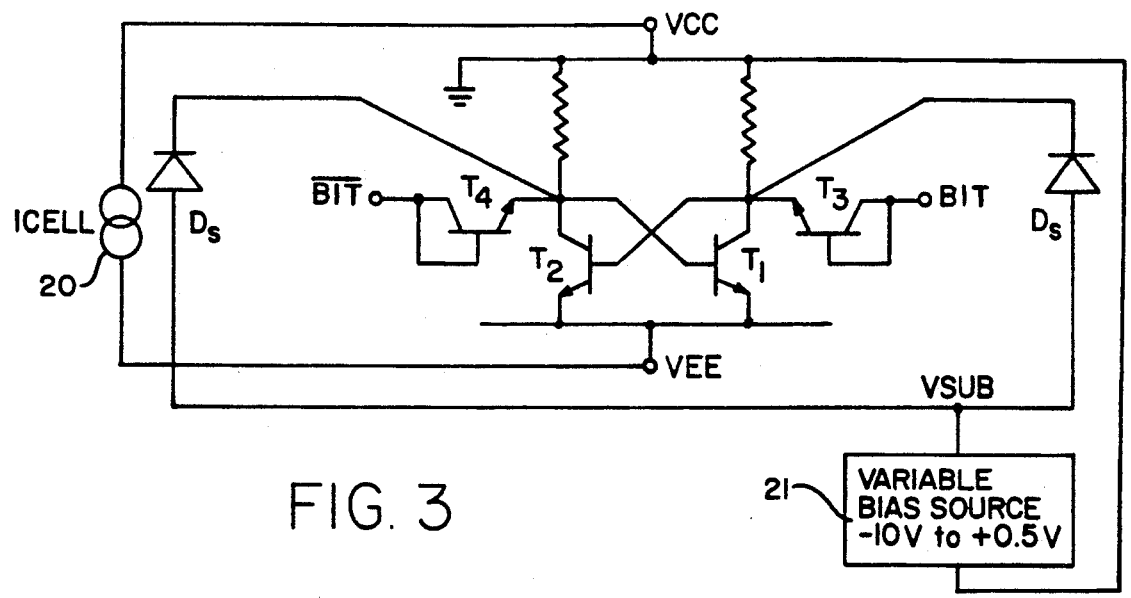
FIG. 3 is a schematic circuit diagram of a single-bit memory cell (flip-flop) fabricated in a buried layer IC to test SEU behavior with the buried-layer-substrate diode, $D_s$, forward biased.

The solution to the problem of single-event upsets in a buried-layer transistor is to bias the substrate relative to the buried layer between about $-1$ volt and $+0.2$ volt, and preferably a positive voltage less than 0.2, such as 0.1. As noted, the substrate 10 is doped p⁻ while the buried layer 14 is doped n⁺, thus providing an isolation junction with a built-in potential barrier between the layers without any external bias voltage being applied. Therefore, an external bias voltage must be applied as shown schematically in FIG. 3, which illustrates schematically a flip-flop circuit used to test the solution to the problem. The two transistors labeled T₁ and T₂ form the data-storage flip-flop. The two transistors labeled T₃ and T₄ are actually read/write diodes, since their collectors are shorted to their bases. Each transistor of the flip-flop was produced in a separate buried layer.

Figure 4:
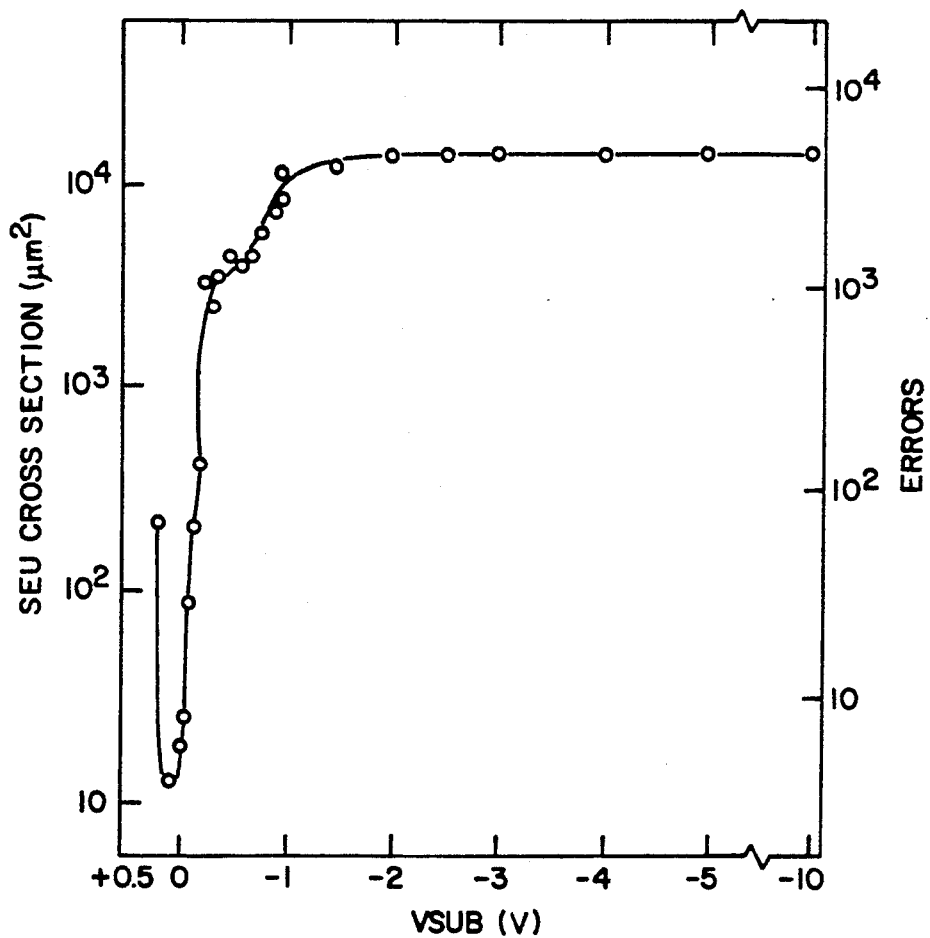
FIG. 4 is a graph of SEU cross section data showing substrate bias (VSUB) dependence for RAM cells in the test IC of FIG. 3.

The test chip was irradiated with an iron (Fe)-ion beam having an energy of 150 MeV. The circuit was powered with a current ICELL of 50 microamperes from a current generator 20. The buried-layer-substrate junction bias was varied from a reverse bias of $-10$ volts to a forward bias of $+0.2$ volt using a source 21 of voltage variable from $-10$ V to $+0.5$ V, as shown. The data obatained (SEU cross section versus bias) is displayed in FIG. 4. Note the decrease by three orders of magnitude in SEU cross section of the circuit as the substrate bias VSUB is varied from full reverse bias (about $-10$ volts) to a slight forward bias (about $+0.1$ volt). At that positive bias level, the SEU cross section begins to increase again as indicated by a test data point at a forward bias of about $+0.2$ volt. This occurs because the logic voltage margin $\Delta V$ shown in FIGS. 2a and 2b decreases as the bias is made more positive.

From the foregoing, it is evident that appropriately biasing the buried-layer-substrate junction diode ($D_s$) will significantly reduce the probability of single-event upsets. Although tests of an integrated circuit fabricated with transistors in buried layers has indicated the optimum forward bias to be about $+0.1$ volt, other designs with different topologies may vary from this optimum, particularly as they are made smaller for higher IC density. However, it is expected that the topology, dimensions and power current of the various areas will not cause this optimum bias voltage to vary significantly. In other words, the optimum bias voltage is expected to remain substantially the same for different IC designs if the power current is scaled for the size of the buried-layer transistor topology used.

An additional benefit resulting from the forward bias of the buried-layer-substrate junction diode ($D_s$) is an increase in data-access speed for a static RAM comprised of an array of flip-flops. This is a result of keeping the data storage transistors T₁ and T₂ out of saturation because of the increase in the potential of the substrate.

In that regard it should be noted that although each transistor of the test circuit is fabricated in a separate buried layer, the substrate is common to all. Consequently, the variable bias source 20 for VSUB is shown connected to both diodes $D_s$ in FIG. 3, one diode for each transistor, since only one bias voltage connection to the substrate is equally effective on both. Although the bias voltage VSUB is shown in FIG. 1b as being applied to the substrate from the back, in practice it is made from the front through the insulating layer ($SiO_2$) somewhere on the chip that is free.

Although a preferred embodiment of the invention has been described and illustrated herein, it is recognized that equivalents and modifications will occur to those skilled in the art, such as the reversal of doping polarities for PNP bipolar transistors instead of the NPN bipolar transistors shown, or the topologies of the base, emitter and collector layers. Consequently, it is intended that the claims be interpreted to cover such equivalents and modifications.

I claim:

1. A method for increasing the resistance of a bipolar buried-layer transistor to single-event upsets due to high-energy ion radiation, said bipolar buried-layer transistor being fabricated in a buried layer of an integrated circuit substrate in which a junction between said buried layer and said substrate is electrically isolated by a built-in potential barrier established by doping said buried layer with a polarity opposite doping in said substrate to prevent leakage of current between bipolar transistors in adjacent buried layers, the step consisting of biasing said substrate relative to said buried layer with an external bias voltage selected to offset the inherent internal bias potential just enough to prevent a collection of charge generated by an incident high-energy ion passing through said buried layer and penetrating said substrate that could produce a time-dependent current through said junction in response to said ion penetrating said junction.

2. A method as defined in claim 1 wherein said substrate is doped p⁻ and said buried layer is doped n⁺, and said external bias is between $-1$ volt and $+0.2$ volt with respect to said buried layer through a collector contact and a contact layer of semiconductor highly doped n⁺⁺.

3. A method as defined in claim 2 wherein said bias voltage is positive and less than about $+0.2$ V.

4. A method as defined in claim 2 wherein said bias voltage is about $+0.1$ V.

5. A method as defined in claim 1 wherein said bipolar transistor has its collector contact on a heavily doped collector contact layer over said buried layer, and wherein said step of biasing said junction between said buried layer and said substrate is carried out by application of said external bias voltage between said collector contact layer and said substrate.

6. Apparatus for increasing the resistance to single-event upsets of a bipolar transistor fabricated in a buried layer of an integrated circuit substrate in which said buried layer is isolated from said substrate by doping in said buried layer with a polarity opposite doping in said substrate to reverse bias a junction between said buried layer and said substrate, thereby to establish a built-in potential barrier that prevents leakage of current between bipolar transistors in adjacent buried layers, comprising a source of external bias voltage, and means for biasing said substrate relative to said buried layer with external bias voltage from said source, said external bias voltage being at a level selected to offset said built-in potential barrier of said junction between said buried layer and said substrate just enough to prevent a collection of charge generated by an incident high energy ion passing through said junction that could produce a time-dependent current through said junction as said ion penetrates said junction.

7. Apparatus as defined in claim 6 wherein said substrate is doped $p^-$ and said buried layer is doped $n^+$, and said external bias voltage level is selected between $-1$ volt and $+0.2$ volt with respect to said buried layer through a collector contact and a contact layer of semiconductor highly doped $n^{++}$.

8. Apparatus as defined in claim 7 wherein said substrate is doped $p^-$ and said buried layer is doped $n^+$, and said external bias voltage level is selected to provide a forward bias of said junction less than about $+0.2$ volt with respect to said buried layer through a collector contact and a contact layer of semiconductor highly doped $n^{++}$.

9. Apparatus as defined in claim 7 wherein said substrate is doped $p^-$ and said buried layer is doped $n^+$, and said external bias voltage level is selected to provide a forward bias of said junction that is about $+0.1$ volt with respect to said buried layer through a collector contact and a contact layer of semiconductor highly doped $n^{++}$.

10. Apparatus as defined in claim 6 wherein said bipolar transistor is provided with a heavily doped layer over said buried layer for a connection to a collector of said transistor, and said means for biasing said junction between said substrate and said buried layer is made by connection of one terminal of said external bias voltage source through a collector load resistor and said collector contact layer to said buried layer, and connection of the other terminal of said external bias voltage source made directly to said substrate.

* * * * *